May 30, 1967 E. L. BRANIECKI, JR 3,323,027

SEMICONDUCTOR DEVICES WITH LAYER OF SILICON MONOXIDE AND GERMANIUM MIXTURE AND METHODS OF FABRICATING THEM

Filed Sept. 16, 1964 2 Sheets-Sheet 1

INVENTOR.
EDWARD L. BRANIECKI, JR
BY
W. S. Hill
AGENT

INVENTOR
EDWARD L. BRANIECKI, JR.
BY
W. S. Hill
AGENT

United States Patent Office 3,323,027

Patented May 30, 1967

3,323,027

SEMICONDUCTOR DEVICES WITH LAYER OF SILICON MONOXIDE AND GERMANIUM MIXTURE AND METHODS OF FABRICATING THEM

Edward Leonard Braniecki, Jr., Somerville, N.J., assignor to Radio Corporation of America, a corporation of Delaware Filed Sept. 16, 1964, Ser. No. 396,885
12 Claims. (Cl. 317—234)

This invention relates to improved semiconductive devices and improved methods of fabricating them. More particularly, the invention relates to improved semiconductor devices having an improved electrically insulating layer on the surface of a crystalline semiconductive wafer.

In the fabrication of certain semiconductor devices, it is desirable to deposit a thin insulating layer on at least a portion of the surface of a crystalline semiconductive substrate such as a wafer or die. A suitable insulating material for this purpose is silicon monoxide, which has a relatively low dielectric constant (about 4 to 6), and which can be deposited by vacuum evaporation. However, the silicon monoxide insulating layers thus deposited are not as pinhole-free as is desirable for many applications. Moreover, the silicon monoxide insulating layers thus deposited do not adhere to the crystalline semiconductive body or substrate as tenaciously as is desirable for some applications, and may partially separate from the semiconductive body during subsequent processing.

It is therefore an object of this invention to provide improved methods of fabricating improved semiconductor devices.

Another object of the invention is to provide improved methods of forming an improved insulating layer on the surface of a semiconductive body.

Still another object is to provide improved methods of forming an adherent pinhole-free silicon monoxide layer on the surface of a semiconductive body.

But another object is to provide an improved semiconductor device including an adherent and pinhole-free silicon monoxide layer on the surface of a crystalline semiconductive body.

These and other objects of the invention are obtained by first vacuum depositing a film of germanium on a cleaned surface of a crystalline semiconductive body. Immediately following this initial deposition of germanium, and without interrupting the deposition process, a layer consisting of a mixture of silicon monoxide (SiO) and germanium is vacuum deposited on the germanium film. Immediately following this step, and without interrupting the deposition process, a coating consisting of silicon monoxide is vacuum deposited on the mixed silicon monoxide-germanium layer. Advantageously, the process is conducted so that the composition of the central layer of mixed silicon monoxide and germanium varies continuously through its thickness from a high concentration of germanium and a low concentration of silicon monoxide adjacent the germanium film to a low concentration of germanium and a high concentration of silicon monoxide adjacent the silicon monoxide coating.

Figure 8:
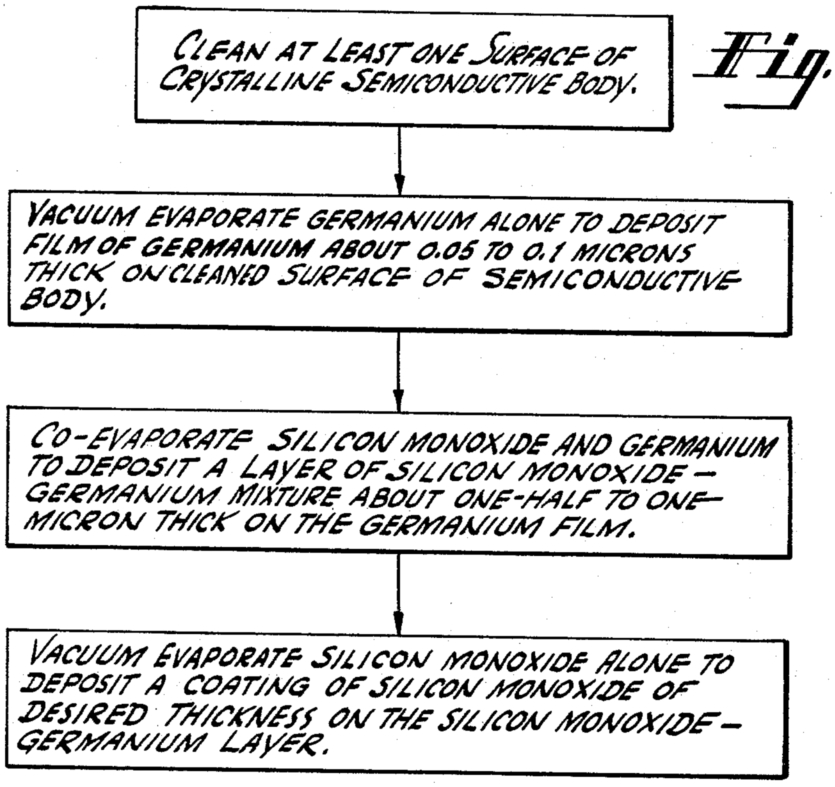

The invention and its objects and advantages will be described in greater detail by the following examples, considered in conjunction with the accompanying drawing, in which:

FIGURES 1–7 are cross-sectional views illustrating successive steps in the fabrication of a semiconductor device according to one embodiment of the invention; and, FIGURE 8 is a flow sheet of the process of forming an improved adherent and pinhole-free insulating layer on a semiconductive body in accordance with the invention.

*Example I*

A body or substrate 10 (FIGURE 1) of crystalline semiconductive material is prepared with at least one major face 11. The precise size, shape, conductivity type and composition of the semiconductive body 10 is not critical. The crystalline semiconductor material utilized may consist of germanium, silicon, germanium-silicon alloys, gallium arsenide, and the like, and may be either P-type or N-type. In this example, the semiconductive body 10 consists of P-type monocrystalline germanium doped with sufficient gallium to have a concentration of about $8\times10^{19}$ to $1\times10^{20}$ charge carriers per cm.$^3$, and is in the form of a die about 30 x 30 mils square, and about 8 mils thick. When the semiconductive body is germanium, it is preferably cut so that the major faces of the die are parallel to the (111) crystal plane. Advantageously, debris and impurities on the surface of die 10 are removed by etching the die for 5 seconds in a suitable etchant such as an aqueous solution of acetic acid and hydrofluoric acid. The surface 11 of die 10 may be further cleaned in the evaporation apparatus, which may, for example, be a glass bell jar (not shown). The evaporation apparatus includes conventional equipment such as pumps, traps, ion bombardment apparatus, evaporation masks, an evaporation mask holder with an electrical resistance heater for heating the substrate on which evaporation takes place, and two tungsten spirals for heating the materials to be evaporated. These are not illustrated since they do not per se form part of this invention, and various forms of commercial equipment may be utilized for this purpose.

The semiconductive die 10 is first heated at about 200° to 300° C. for about 5 to 15 minutes at a reduced pressure of about $1\times10^{-6}$ mm. Hg. The system is then flushed with argon or nitrogen for about 2 minutes, then pumped down to a residual pressure of about $1\times10^{-3}$ mm. Hg. Advantageously, surface 11 of die 10 is then cleaned by ion bombardment from a glow discharge.

The system is again pumped down to a residual pressure of about $1\times10^{-6}$ mm. Hg, and the semiconductive die is heated in vacuo for about 10 minutes at about 200° to 300° C. A suitable metal evaporation mask (not shown) is positioned over face 11 of die 10. In this example, the evaporation mask utilized has a circular perforation about 3 mils in diameter. Electrical energy is then supplied for about 1 minute to a first tungsten spiral containing crushed or granulated germanium (not shown). As a result, a film of germanium 14 (FIGURE 2) is deposited by evaporation on face 11 of die 10. The deposited germanium film 14 has the size and shape of the mask perforation. In this example, the germanium film 14 is a circle 3 mils in diameter, and is about 0.05 to 0.1 micron thick.

While continuing the vacuum deposition of the germanium, a second tungsten spiral containing silicon monoxide (not shown) is energized. Both tungsten spirals are heated for about 1 to 2 minutes. As a result, a layer 16 (FIGURE 3) consisting of a mixture of silicon monoxide and germanium is deposited on the germanium film 14. In this example, the mixed layer 16 is about 0.5 to 1.0 micron thick.

The suppy of current to the first tungsten spiral is now terminated, thus ending the evaporation of germanium from that spiral. However, the evaporation of silicon monoxide from the second spiral is continued, thus depositing a coating 18 (FIGURE 4) of pure silicon monoxide on the mixed germanium-silicon monoxide layer 16. The electric current which supplies the two evaporators may be turned on and off slowly. In this manner, the rate at which the silicon monoxide and germanium is evaporated also changes slowly, so that the composition of the central layer 16 varies continuously through its thickness from rich in germanium and poor in silicon monoxide adjacent germanium film 14 to poor in germanium and rich in silicon monoxide away from germanium film 14 and adjacent silicon monoxide coating 18, thus providing a smooth transition between germanium film 14 and silicon monoxide coating 18.

The evaporation is continued until the silicon monoxide coating 18 has achieved the desired thickness. The silicon monoxide coating 18 may be varied in thickness from one micron to several millimeters. Generally the thickness of the silicon monoxide coating 18 is greater than the combined thickness of the germanium film 14 and the germanium-silicon oxide layer 16. In this example, the silicon monoxide coating 18 is about 15 microns thick. The wafer 10 is then cooled to room temperature in a non-oxidizing ambient such as argon. The combination of the germanium film 14, the silicon monoxide-germanium layer 16, and the silicon monoxide coating 18 forms a mesa which serves as a mask 20 on surface 11 of semiconductive wafer 10 during the subsequent device processing, which in this example includes fabrication of a surface alloyed p-n junction. The thickness of the various layers in the drawing is not to scale, having been exaggerated for greater clarity.

Figure 1:
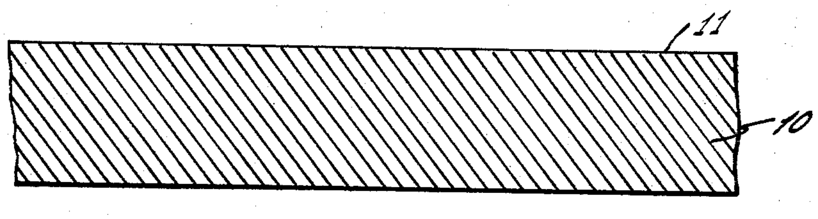
Figure 2:
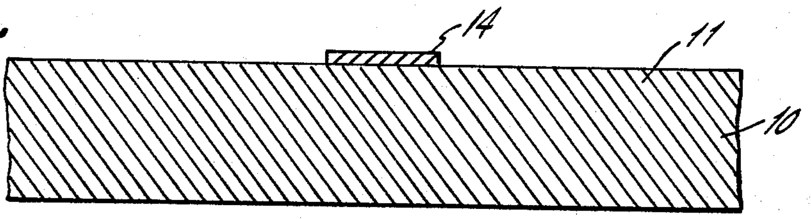
Figure 3:
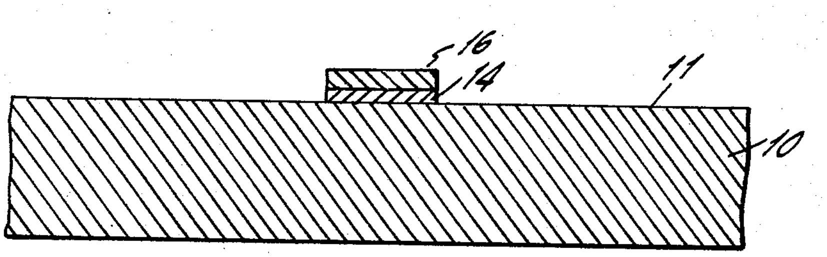
Figure 4:
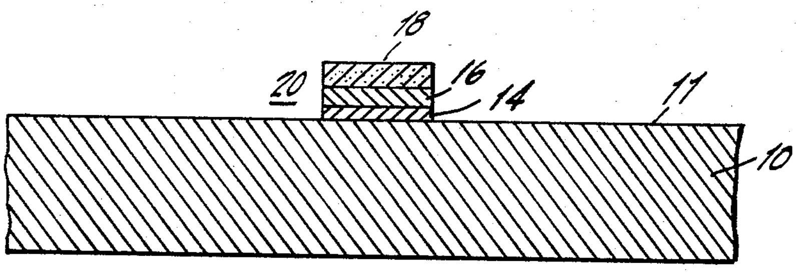
Figure 5:
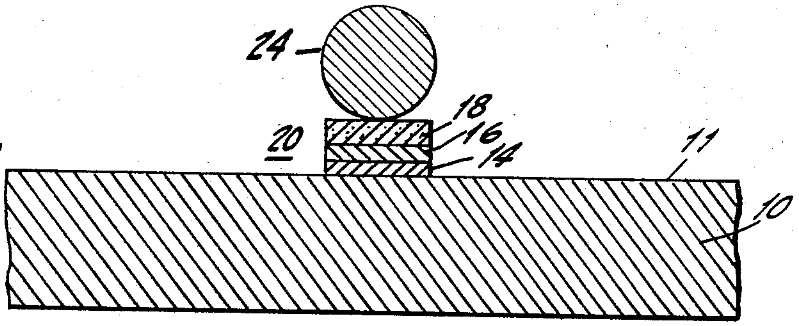

Referring now to FIGURE 5, an electrode pellet 24 containing a conductivity type modifier (i.e., an acceptor or a donor) is positioned on top of mask 20. Suitably, the pellet 24 includes material capable of inducing opposite conductivity type in the given conductivity type semiconductive wafer 10. In this example, the electrode pellet 24 consists of 97 weight percent tin—3 weight percent arsenic. The precise size and shape of electrode pellet 24 is not critical, and may, for example, be a disc. In this example, pellet 24 is a dot or spherule about 8 mils in diameter. The pellet or spherule 24 is conveniently picked up with a pointed tool wetted with glycerin containing 1 weight percent ammonium chloride, and is positioned on mask 20 as is shown in FIGURE 5. The glycerin holds the pellet 24 in place for the subsequent alloying step, and the ammonium chloride acts as a flux to promote uniform alloying.

Figure 6:
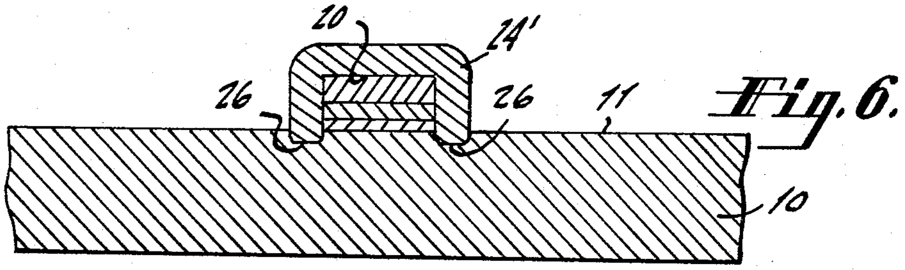
Figure 7:
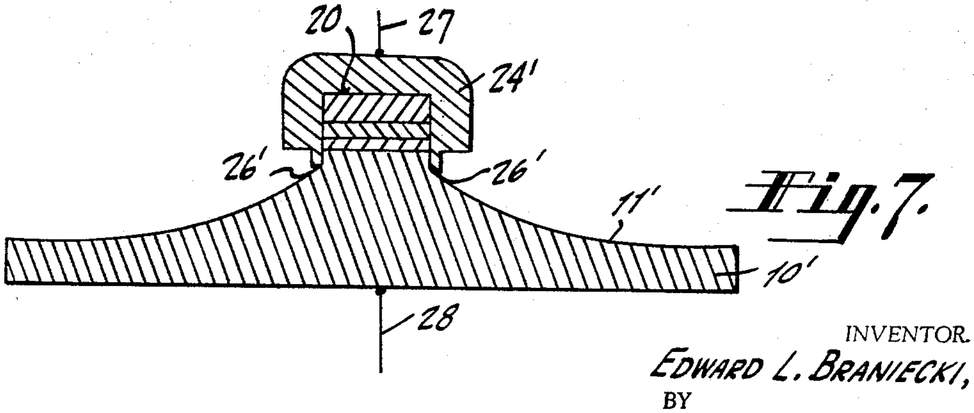

The assemblage of semiconductive die 10, mask 20, and electrode pellet 24 is then heated in a furnace (not shown) so as to fuse or alloy pellet 24 to face 11 of semiconductive die 10. Preferably, a non-oxidizing or reducing ambient is maintained in the furnace during this step. The optimum heating profile utilized depends on the particular semiconductor employed, the composition of the electrode pellet, and the like, and hence is best determined by tests. In this example, alloying is performed by heating the assemblage for about 7 minutes at about 480° C. in a hydrogen ambient. The assemblage is then allowed to cool in the furnace in an atmosphere of hydrogen. During this heating cycle, the electrode pellet 24 is melted, and on cooling, re-solidifies in a roughly hemispherical shape 24' as shown in FIGURE 6. The portion of the re-solidified electrode pellet 24' which overhangs the mask 20 is thus alloyed to face 11 of wafer 10, and forms a p-n junction 25 around the periphery of mask 20. However, no such alloying takes place beneath the central portion of electrode pellet 24', because the inert insulating mask 20 serves as a physical barrier between those portions of electrode pellet 24' and semiconductive die 10 which are respectively immediately above and below mask 20. The mask 20 thus prepared, which is principally silicon monoxide, has the advantage of being pinhole-free, and hence prevents any spiking between the electrode pellet 24' above the mask and the semiconductive die below the mask. Moreover, the mask 20 according to the invention adheres tenaciously to the semiconductive wafer during the fabrication process.

The device of this example has a thin rectifying barrier 26 which exhibits the phenomenon known as tunneling, and hence is popularly known as a tunnel diode. For a description of these devices and their electrical characteristics, see H. S. Sommers, Jr., Tunnel Diodes as High Frequency Devices, Proceedings IRE, Volume 47, page 1201, July 1959. For many applications it is desirable to decrease the area of the rectifying barrier 26. This may be accomplished by electrolytic etching of the wafer 10 around the alloyed electrode 24', so that in the etched wafer 10' (FIGURE 7) one major wafer face 11' slopes downward from the mask 20. The remaining portion 26' of the rectifying barrier or p-n junction is small in area, but is sturdily supported by the electrically inert portion of the semiconductive wafer 10' which is immediately beneath the insulating mask 20. The device may then be encapsulated and cased, for example, as described in U.S. Patent 3,001,113, issued on Sept. 19, 1961 to C. W. Mueller, and assigned to the assignee of this application. Tunnel diodes which exhibit capacitance values as low as 1 to 3 picofarads may be made in this manner. Alternatively, an electrical lead wire 27 may be bonded to electrode 24', for example by soldering or thermocompression bonding; another electrical lead wire 28 may be similarly bonded to wafer 10', for example to the wafer face opposite face 11'; and the device then encapsulated and cased by standard methods of the semiconductor art.

Although the invention has been described above as applied to the fabrication of a tunnel diode, it will be understood that this is by way of illustration only, and not limitation. The insulating coating according to the invention may be employed wherever an adherent and pinhole-free insulating layer is desired on a part or on all of a semiconductive wafer surface. Since the insulating layer thus formed is pinhole-free, it may also be used as a mask during the diffusion of a conductivity modifier into a semiconductive wafer. Various other modifications may be made without departing from the spirit and scope of the invention as set forth in the specification and appended claims.

What is claimed is:

1. A semiconductor device comprising a crystalline semiconductive body having at least one major face; an insulating layer on at least a portion of said one face, said insulating layer comprising a film of germanium on said one face, a layer of silicon monoxide and germanium mixture on said germanium film, and a coating of silicon monoxide on said silicon monoxide-germanium layer; and an electrode on said silicon monoxide coating, said electrode being electrically connected to said body.

2. A semiconductor device comprising a monocrystalline germanium body having at least one major face;

an insulating layer on at least a portion of said one face, said insulating layer comprising a film of germanium on said one face, a layer consisting of a mixture of silicon monoxide and germanium on said germanium film, and a coating of silicon monoxide on said silicon monoxide-germanium mixture layer; and, an electrode on said silicon monoxide coating, said electrode being electrically connected to said germanium body.

3. A semiconductor device comprising a monocrystalline germanium body having at least one major face;

an insulating layer on at least a portion of said one face, said insulating layer comprising a film of germanium about .05 to 0.1 micron thick on said one face, a layer consisting of a mixture of silicon monoxide and germanium about 0.5 to 1 micron thick on said germanium film, and a coating of silicon monoxide on said silicon monoxide-germanium mixture layer;

an electrode on said silicon monoxide coating, said electrode being electrically connected to said germanium body; and, an electrical lead to said electrode.

4. A semiconductor device comprising a monocrystalline semiconductive germanium body having at least one major face;

an insulating layer on at least a portion of said one face, said insulating layer comprising a film of germanium about .05 to 0.1 micron thick on said one face, a layer consisting of a mixture of silicon monoxide and germanium about .05 to 0.1 micron thick on said germanium film, and a coating of silicon monoxide on said silicon monoxide-germanium mixture layer, the composition of said silicon monoxide-germanium layer varying continuously through its thickness from a high concentration of germanium and a low concentration of silicon monoxide adjacent said germanium film to a low concentration of germanium and a high concentration of silicon monoxide adjacent said silicon monoxide coating; and, an electrode on said silicon monoxide coating, said electrode being electrically connected to said germanium body.

5. The method of forming an insulating layer on a crystalline semiconductor comprising:

(1) vacuum depositing a germanium film on a clean surface of a crystalline semiconductor;

(2) vacuum depositing a layer consisting of a mixture of silicon monoxide and germanium on said germanium film; and, (3) vacuum depositing a coat of silicon monoxide on said silicon monoxide-germanium mixture layer.

6. The method of forming an insulating layer on a crystalline semiconductor comprising:

(1) cleaning a surface on said crystalline semiconductor;

(2) vacuum depositing a germanium film on said cleaned surface;

(3) continuing said vacuum deposition of germanium, and additionally vacuum depositing silicon monoxide simultaneously with germanium, thereby producing a mixed layer of silicon monoxide and germanium on said germanium film; and, (4) continuing said deposition of silicon monoxide and simultaneously interrupting the deposition of germanium, thereby producing a coating of silicon monoxide on said mixed layer of silicon monoxide and germanium.

7. The method of forming an insulating layer on a crystalline germanium body comprising:

(1) cleaning a surface on said germanium body;

(2) vacuum depositing a germanium film on said cleaned surface;

(3) continuing said vacuum deposition of germanium, and additionally vacuum depositing silicon monoxide simultaneously with germanium, thereby producing a mixed layer of silicon monoxide and germanium on said germanium film; and, (4) continuing said deposition of silicon monoxide and simultaneously interrupting the deposition of germanium, thereby producing a coating of silicon monoxide on said mixed layer of silicon monoxide and germanium.

8. The method of forming an insulating layer on a crystalline semiconductive body comprising:

(1) cleaning a surface on said crystalline body;

(2) vacuum depositing a germanium film about .05 to 0.1 micron thick on said cleaned surface;

(3) continuing said vacuum deposition of germanium, and additionally vacuum depositing silicon monoxide simultaneously with germanium, thereby producing a mixed layer of silicon monoxide and germanium about 0.5 to 1.0 micron thick on said germanium film; and, (4) continuing said deposition of silicon monoxide and simultaneously interrupting the deposition of germanium, thereby producing a coating of silicon monoxide on said mixed layer of silicon monoxide and germanium.

9. The method of forming an insulating layer on a crystalline germanium body comprising:

(1) cleaning a surface on said germanium body;

(2) vacuum depositing a germanium film about .05 to 0.1 micron thick on said cleaned surface;

(3) continuing said vacuum deposition of germanium, and additionally vacuum depositing silicon monoxide simultaneously with germanium, thereby producing a mixed layer of silicon monoxide and germanium about 0.5 to 1.0 micron thick on said germanium film; and, (4) continuing said deposition of silicon monoxide and simultaneously interrupting the deposition of germanium, thereby producing a coating of silicon monoxide on said mixed layer of silicon monoxide and germanium.

10. The method of forming an insulating layer on a crystalline semiconductor comprising:

(1) cleaning a surface on said crystalline semiconductor;

(2) vacuum depositing a germanium film on said cleaned surface;

(3) continuing said vacuum deposition of germanium, and additionally vacuum depositing silicon monoxide simultaneously with germanium, thereby producing a mixed layer of silicon monoxide and germanium on said germanium film; and, (4) continuing said deposition of silicon monoxide and simultaneously interrupting the deposition of germanium, thereby producing a coating of silicon monoxide on said mixed layer of silicon monoxide and germanium, the composition of said mixed layer of silicon monoxide and germanium varying continuously through its thickness from a high concentration of germanium and a low concentration of silicon monoxide adjacent said germanium film to a low concentration of germanium and a high concentration of silicon monoxide adjacent said silicon monoxide coating.

11. The method of forming an insulating layer on a crystalline semiconductive body comprising:

(1) cleaning a surface on said crystalline body;

(2) vacuum depositing a germanium film about .05 to 0.1 micron thick on said cleaned surface;

(3) continuing said vacuum deposition of germanium, and additionally vacuum depositing silicon monoxide simultaneously with germanium, thereby producing a mixed layer of silicon monoxide and germanium about 0.5 to 1.0 micron thick on said germanium film; and, (4) continuing said deposition of silicon monoxide and simultaneously interrupting the deposition of germanium, thereby producing a coating of silicon monoxide on said mixed layer of silicon monoxide and germanium, the composition of said silicon monoxide-germanium mixture layer varying continuously through its thickness from a high concentration of germanium and a low concentration of silicon monoxide adjacent said germanium film to a low concentration of germanium and a high concentration of silicon monoxide adjacent said silicon monoxide coating.

12. The method of forming an insulating layer on a crystalline germanium body comprising:

(1) cleaning a surface on said germanium body;

(2) vacuum depositing a germanium film about .05 to 0.1 micron thick on said cleaned surface;

(3) continuing said vacuum deposition of germanium; and additionally vacuum depositing silicon monoxide simultaneously with germanium, thereby producing a mixed layer of silicon monoxide and germanium about 0.5 to 1.0 micron thick on said germanium film; and, (4) continuing said deposition of silicon monoxide and simultaneously interrupting the deposition of germanium, thereby producing a coating of silicon monoxide on said mixed layer of silicon monoxide and germanium, the composition of said silicon monoxide-germanium mixture layer varying continuously through its thickness from a high concentration of germanium and a low concentration of silicon monoxide adjacent said germanium film to a low concentration of germanium and a high concentration of silicon monoxide adjacent said silicon monoxide coating.

No references cited.

JAMES D. KALLAM, *Primary Examiner.*